(12) United States Patent
El-Kareh et al.

(10) Patent No.: US 9,361,981 B2
(45) Date of Patent: Jun. 7, 2016

(54) METHODS OF FORMING AND PROGRAMMING MEMORY DEVICES WITH ISOLATION STRUCTURES

(71) Applicant: Micron Technology, Inc., Boise, ID (US)

(72) Inventors: Badih El-Kareh, Cedar Park, TX (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 152 days.

(21) Appl. No.: 14/179,164

(22) Filed: Feb. 12, 2014

(65) Prior Publication Data
US 2014/0169103 A1   Jun. 19, 2014

Related U.S. Application Data

(62) Division of application No. 11/811,702, filed on Jun. 12, 2007, now Pat. No. 8,654,592.

(51) Int. Cl.

| | | |
|---|---|---|
| G11C 11/34 | (2006.01) |
| G11C 16/04 | (2006.01) |
| H01L 21/28 | (2006.01) |
| H01L 27/115 | (2006.01) |
| H01L 29/66 | (2006.01) |
| H01L 29/788 | (2006.01) |
| G11C 16/10 | (2006.01) |

(52) U.S. Cl.
CPC ............ *G11C 16/0408* (2013.01); *G11C 16/10* (2013.01); *H01L 21/28273* (2013.01); *H01L 27/115* (2013.01); *H01L 27/11521* (2013.01); *H01L 27/11524* (2013.01); *H01L 29/66825* (2013.01); *H01L 29/7881* (2013.01)

(58) Field of Classification Search
CPC ............ H01L 21/28273; H01L 27/115; H01L 27/11521; H01L 27/11524; H01L 29/66825; H01L 29/7881
See application file for complete search history.

(56) References Cited

U.S. PATENT DOCUMENTS

| | | | |
|---|---|---|---|
| 6,107,659 A | 8/2000 | Onakado et al. |
| 6,198,137 B1 | 3/2001 | Ashida |

(Continued)

OTHER PUBLICATIONS

F. Masuoka et al., "New Ultra High Density EPROM and Flash EPROM with NAND Structure Cell", IEEE IEDM Tech. Dig., 1987, pp. 552-555.

(Continued)

*Primary Examiner* — Meiya Li
(74) *Attorney, Agent, or Firm* — Dicke, Billig & Czaja, PLLC

(57) ABSTRACT

Methods of programming and forming memory devices. Methods of programming include biasing a control gate of a selected memory cell of the memory device to a first voltage, the control gate being over a first conductive region having a first conductivity type and the first conductive region being over a second conductive region having a second conductivity type different than the first conductivity type; biasing the second conductive region to a second voltage to forward bias the junction from the second conductive region to the first conductive region; and injecting electrons into a charge-storage node of the selected memory cell from the second conductive region. The first conductive region and the second conductive region are contained within a dielectric isolation structure in which at least the selected memory cell is contained.

20 Claims, 12 Drawing Sheets

(56) References Cited

U.S. PATENT DOCUMENTS

| | | |
|---|---|---|
| 6,504,763 B1 | 1/2003 | Yang et al. |
| 6,566,177 B1 | 5/2003 | Radens et al. |
| 7,138,684 B2 | 11/2006 | Hidaka et al. |
| 2005/0111260 A1 | 5/2005 | Nazarian |
| 2005/0127473 A1 | 6/2005 | Sakagami |
| 2005/0276094 A1 | 12/2005 | Yamaoka et al. |

OTHER PUBLICATIONS

Brown et al. Eds. "Nonvolatile Semiconductor Memory Technology," IEEE Press, 1998 pp. 241-245.

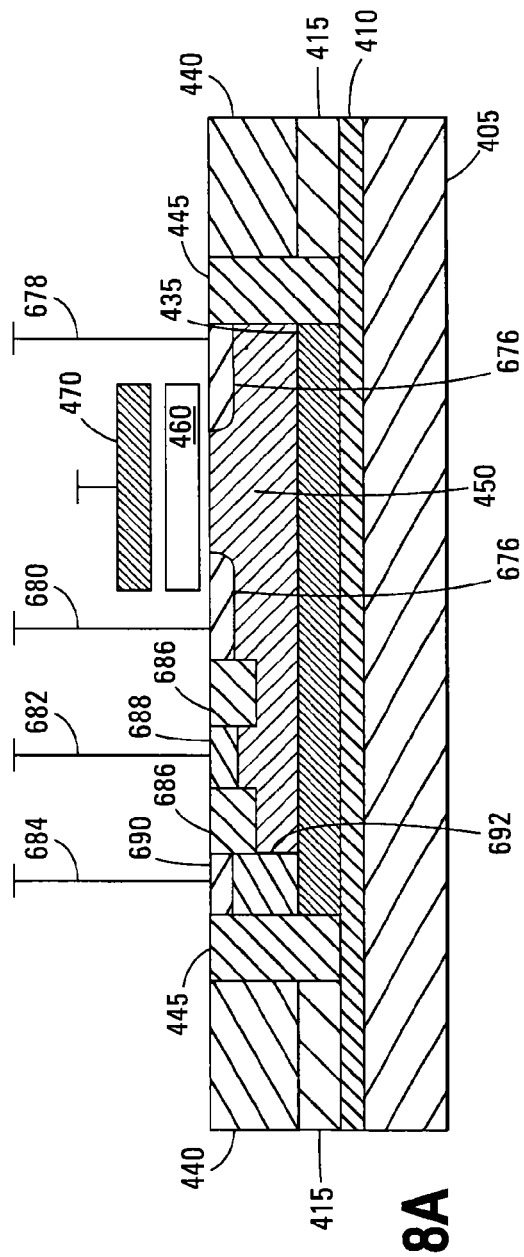
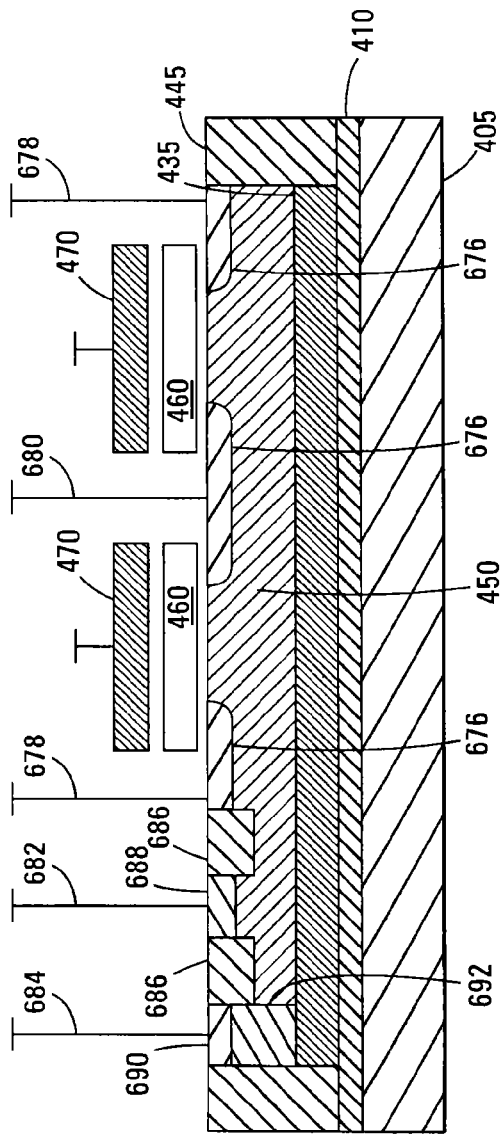
FIG. 8A
FIG. 8B

METHODS OF FORMING AND PROGRAMMING MEMORY DEVICES WITH ISOLATION STRUCTURES

RELATED APPLICATION

This Application is a divisional of U.S. application Ser. No. 11/811,702, filed Jun. 12, 2007 and issued as U.S. Pat. No. 8,654,592 on Feb. 18, 2014, which is commonly assigned and incorporated herein by reference.

TECHNICAL FIELD

The present disclosure relates generally to memory devices, and in a particular, embodiment the present disclosure relates to non-volatile memory devices having dielectrically isolated memory cells and their operation.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. By defining two or more ranges of threshold voltages to correspond to individual data values, one or more bits of information may be stored on each cell. Common uses for flash memory and other non-volatile memory include personal computers, personal digital assistants (PDAs), digital cameras, digital media players, digital recorders, games, appliances, vehicles, wireless devices, cellular telephones, and removable memory modules, and the uses for non-volatile memory continue to expand.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

Flash memory is often based on the Floating-Gate Avalanche-Injection Metal Oxide Semiconductor (FAMOS transistor) which is essentially a Complementary Metal Oxide Semiconductor (CMOS) Field-Effect Transistor (FET) with an additional conductor layer suspended between the gate and source/drain terminals. Such flash cells are thus similar to a standard MOSFET transistor, except that they have two gates instead of just one. One gate is the control gate (CG) like in other MOS transistors, but the second is a floating gate (FG) that is insulated all around by a dielectric layer. The FG is between the CG and the substrate. Because the FG is isolated by its insulating oxide layer, it is capable of trapping electrons placed in it and thus storing information.

When electrons are trapped on the FG, they modify (partially cancel out) an electric field coming from the CG, which modifies the threshold voltage (Vt) of the cell. Thus, when the cell is "read" by placing a specific voltage on the CG, electrical current will either flow or not flow between the cell's source and drain connections, depending on the Vt of the cell. This presence or absence of current is sensed and translated into 1's and 0's, reproducing the stored data values of the cells.

Programming efficiency in flash memory, which is defined as a ratio of transistor gate current to programming drain-source current, is an important factor in determining power consumption in flash memories. The programming efficiency of flash memory cells, which utilize hot-electron injection, has been enhanced by applying a substrate bias.

Mechanisms of hot-electron injection in a floating gate transistor during a program operation are well known. The channel hot electron (CHE) component comes from energetic channel electrons which are accelerated by lateral electric fields along a channel of the floating gate transistor. A channel initiated secondary electron (CHISEL) component comes from energetic electrons that are generated by hole impact ionization in the substrate and accelerated by vertical electric fields.

A gate current (Ig) by hot-electron injection in a program mode can be expressed as $Ig=I_{CHE}+I_{CHISEL}$. The $I_{CHE}$ component comes from energetic channel electrons which are accelerated by a channel electric field. The $I_{CHISEL}$ component comes from energetic electrons that are generated by hole impact ionization in the substrate and accelerated by a vertical electric field.

Known techniques for writing electrons onto the floating gate are still very inefficient. The drain current is on the order of a million times the gate current, or only about one in every million electrons flowing down the transistor channel is injected or results in an electron being injected on to the floating gate. This requires that a high drain current be used during writing, resulting in excessive power dissipation.

A BiMOS structure has been used to study the basic physical mechanisms of electron trapping in MOS gate oxides; see FIG. 9. The test structure 900 included a gate 902, a gate oxide layer 904, source 906 and drain 908. A buried bipolar emitter-base diode, formed of layers 912 and 914 in substrate 905, was used to inject electrons 916 which were accelerated in a surface depletion region and injected into the gate oxide 904. Excess electrons were collected by reverse biasing the drain 908 and/or source 906 regions.

For the reasons stated above, and for other reasons which will become apparent to those skilled in the art upon reading and understanding the present specification, there is a need in the art for alternative memory architectures for improved efficiency and reduced power consumption in programming a non-volatile memory cell.

BRIEF DESCRIPTION OF THE DRAWINGS

FIG. 8A-8B are simplified cross-sectional views of memory cells for use in a memory array utilizing a NOR architecture.

DETAILED DESCRIPTION

In the following detailed description of the present embodiments, reference is made to the accompanying drawings that form a part hereof, and in which is shown by way of illustration specific embodiments in which the disclosure may be practiced. These embodiments are described in sufficient detail to enable those skilled in the art to practice the invention, and it is to be understood that other embodiments may be utilized and that process, chemical, electrical or mechanical changes may be made without departing from the scope of the present disclosure. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. In addition, directional references, e.g., upper, lower, top, bottom and sides, are relative to one another and need not refer to an absolute direction. The following detailed description is, therefore, not to be taken in a limiting sense, and the scope of the invention is defined only by the appended claims and equivalents thereof.

Figure 1:
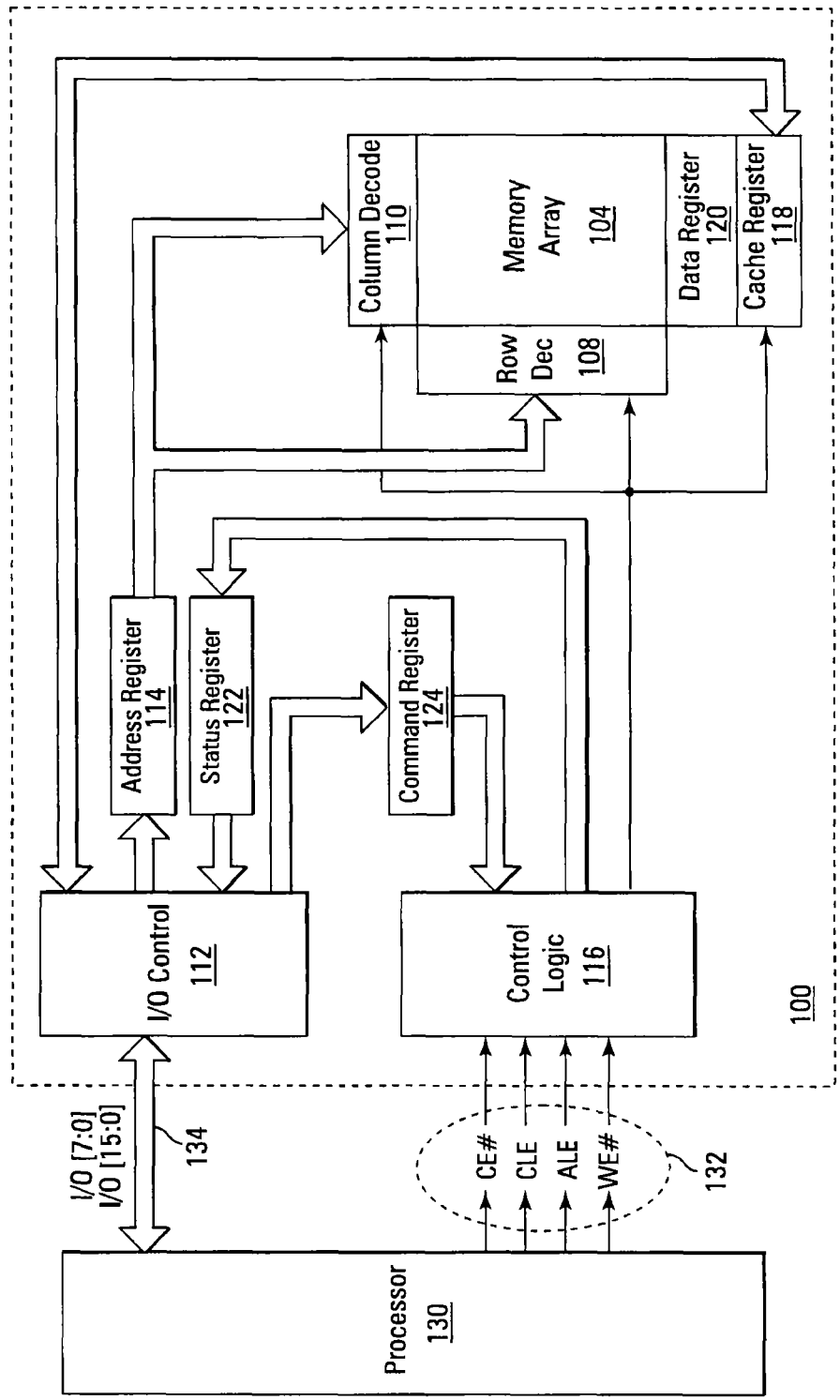
FIG. 1 is a simplified block diagram of a memory device coupled to a processor as part of an electronic system, according to an embodiment of the disclosure.

FIG. 1 is a simplified block diagram of a memory device 100 in communication with (e.g., coupled to) a processor 130 as part of an electronic system, according to an embodiment of the disclosure. Some examples of electronic systems include personal computers, personal digital assistants (PDAs), digital cameras, digital media players, digital recorders, games, appliances, vehicles, wireless devices, cellular telephones and the like. The processor 130 may be a memory controller or other external processor.

Memory device 100 includes an array of memory cells 104 arranged in rows and columns. The array of memory cells 104 includes isolation structures in accordance with one or more of the various embodiments. Although the various embodiments will be described primarily with reference to NAND memory arrays, the various embodiments are not limited to a specific architecture of the memory array 104. Some examples of other array architectures suitable for the present embodiments include NOR arrays, AND arrays, and virtual ground arrays.

A row decode circuitry 108 and a column decode circuitry 110 are provided to decode address signals. Address signals are received and decoded to access memory array 104. Memory device 100 also includes input/output (I/O) control circuitry 112 to manage input of commands, addresses and data to the memory device 100 as well as output of data and status information from the memory device 100. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is coupled between I/O control circuitry 112 and control logic 116 to latch the status information for output to the processor 130.

Memory device 100 receives control signals at control logic 116 from processor 130 over a control link 132. The control signals may include a chip enable CE#, a command latch enable CLE, an address latch enable ALE, and a write enable WE# in accordance with the present invention. Memory device 100 receives commands (in the form of command signals), addresses (in the form of address signals), and data (in the form of data signals) from processor 130 over a multiplexed input/output (I/O) bus 134 and outputs data to processor 130 over I/O bus 134.

Specifically, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:01] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device. It will be appreciated by those skilled in the art that additional circuitry and signals can be provided, and that the memory device of FIG. 1 has been simplified to help focus on the present disclosure. Additionally, while the memory device of FIG. 1 has been described in accordance with popular conventions for receipt and output of the various signals, it is noted that the various embodiments are not limited by the specific signals and I/O configurations described unless expressly noted herein.

Figure 2:
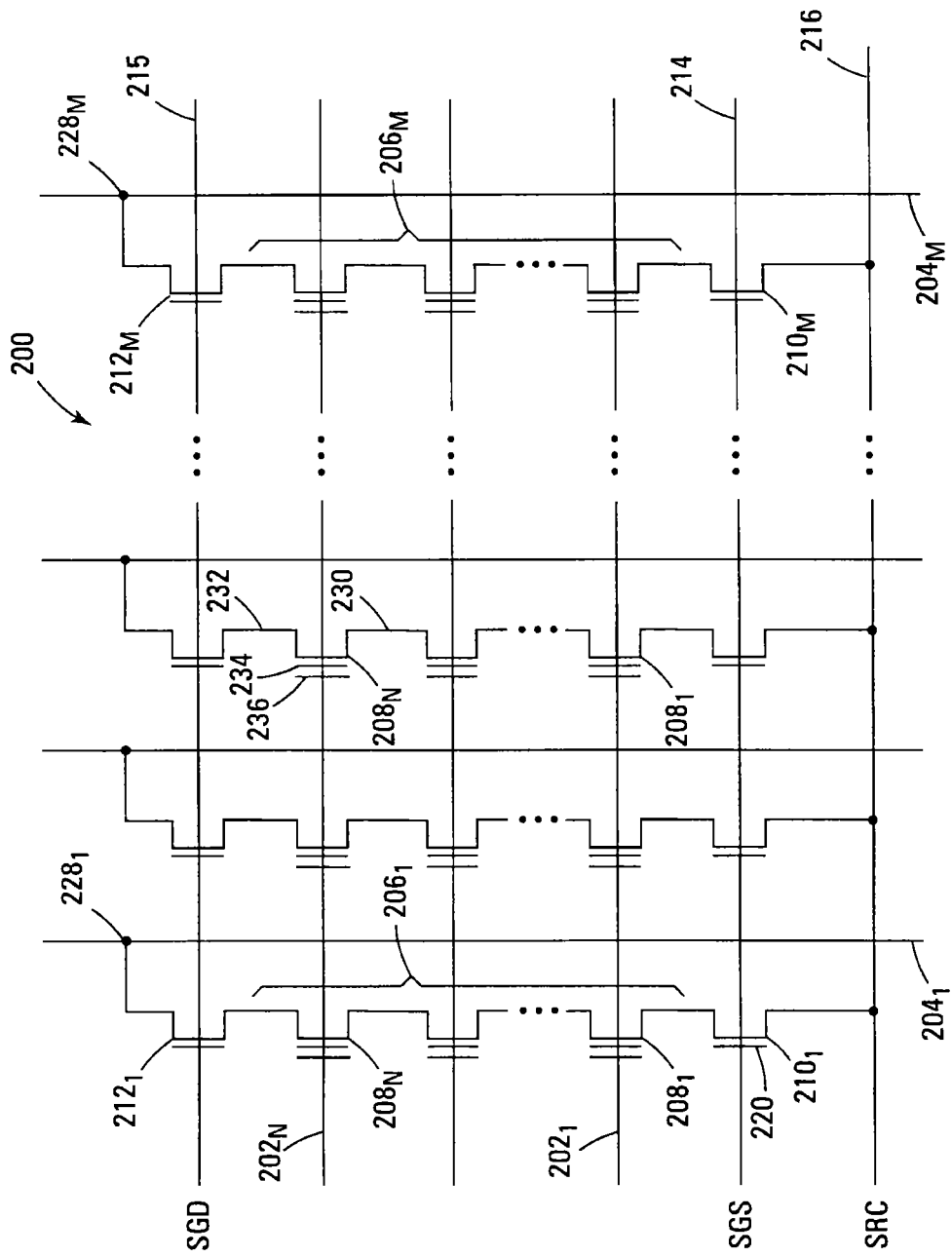
FIG. 2 is a schematic of a NAND memory array as might be found in the memory array of FIG. 1.

FIG. 2 is a schematic of a NAND memory array 200 as might be found in the memory array 104 of FIG. 1 in accordance with another embodiment of the disclosure. As shown in FIG. 2, the memory array 200 includes word lines $202_1$ to $202_N$ and intersecting bit lines $204_1$ to $204_M$. For ease of addressing in the digital environment, the number of word lines 202 and the number of bit lines 204 typically are each some power of two.

Memory array 200 includes NAND strings $206_1$ to $206_M$ formed in accordance with one or more of the various embodiments. Each NAND string includes floating-gate transistors $208_1$ to $208_N$, each located at an intersection of a word line 202 and a bit line 204. The floating-gate transistors 208 represent non-volatile memory cells for storage of data. The floating-gate transistors 208 of each NAND string 206 are connected in series source to drain between a source select gate 210, e.g., a field-effect transistor (FET), and a drain select gate 212, e.g., an FET. Each source select gate 210 is located at an intersection of a bit line 204 and a source select line 214, while each drain select gate 212 is located at an intersection of a bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate 220 of each source select gate 210 is connected to source select line 214. If multiple source select gates 210 are utilized for a given NAND string 206, they would be coupled in series between the common source line 216 and the first floating-gate transistor 208 of that NAND string 206.

The drain of each drain select gate 212 is connected to a bit line 204 for the corresponding NAND string at a drain contact 228. For example, the drain of drain select gate $212_1$ is connected to the bit line $204_1$ for the corresponding NAND string $206_1$ at drain contact $228_1$. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$. If multiple drain select gates 212 are utilized for a given NAND string 206, they would be coupled in series between the corresponding bit line 204 and the last floating-gate transistor $208_N$ of that NAND string 206.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202.

Figure 3:
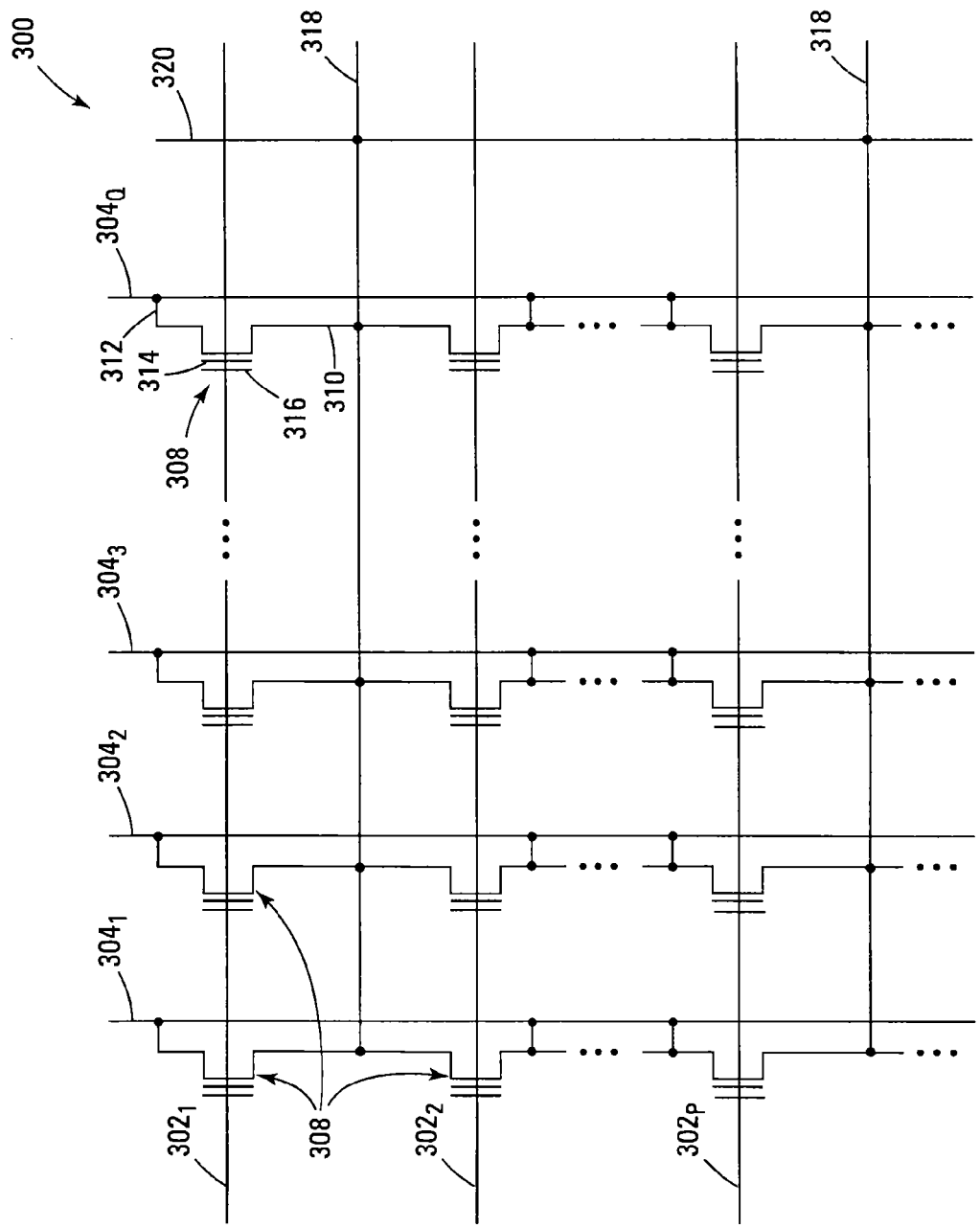
FIG. 3 is a schematic of a NOR memory array as might be found in the memory array of FIG. 1.

FIG. 3 is a schematic of a NOR memory array 300 as might be found in the memory array 104 of FIG. 1 in accordance with another embodiment of the disclosure. Memory array 300 includes word lines $302_1$ to $302_P$ and intersecting local bit lines $304_1$ to $304_Q$. For ease of addressing in the digital environment, the number of word lines 302 and the number of bit lines 304 typically are each some power of two. The local bit lines 304 are coupled to global bit lines (not shown) in a many-to-one relationship.

Floating-gate transistors 308 are located at each intersection of a word line 302 and a local bit line 304. The floating-gate transistors 308 represent non-volatile memory cells for storage of data. Construction of floating-gate transistors 308 includes a source 310 and a drain 312, a floating gate 314, and a control gate 316, as shown in FIG. 3. The floating-gate transistors 308 are formed in accordance with one or more of the various embodiments.

Floating-gate transistors 308 having their control gates 316 coupled to a word line 302 typically share a common source depicted as array source 318. As shown in FIG. 3, floating-gate transistors 308 coupled to two adjacent word lines 302 may share the same array source 318. Floating-gate transistors 308 have their drains 312 coupled to a local bit line 304. A column of the floating-gate transistors 308 includes those transistors commonly coupled to a given local bit line 304. A row of the floating-gate transistors 308 includes those transistors commonly coupled to a given word line 302.

To reduce problems associated with high resistance levels in the array source 318, the array source 318 may be regularly coupled to a metal or other highly conductive line to provide a low-resistance path to ground. The array ground 320 serves as this low-resistance path.

Figure 4A:
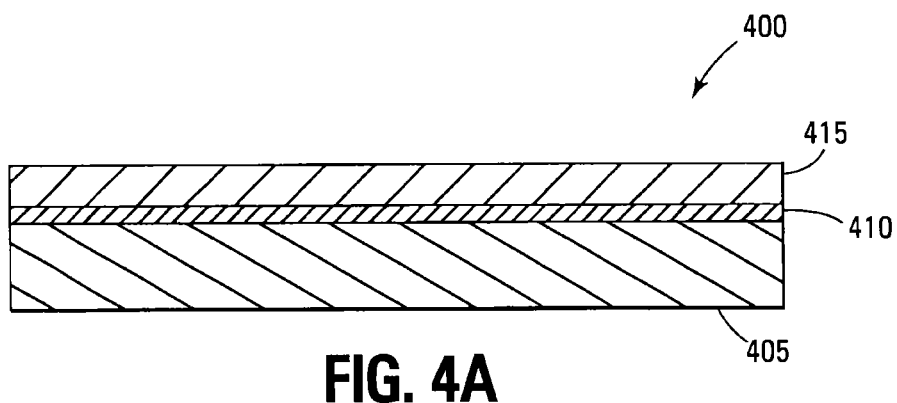
FIGS. 4A-4F are simplified cross-sectional views of a portion of a memory array during various stages of fabrication in accordance with an embodiment of the disclosure.

FIGS. 4A-4F generally depict a method of forming a portion of a memory array in accordance with an embodiment of the disclosure. FIG. 4A depicts a support structure 400 of the memory array after one or more processing steps have occurred. Formation of the type of structure depicted in FIG. 4A is well known and will not be detailed herein. In general, the support structure 400 includes two substrates, a lower substrate 405 and an upper substrate 415 between which a dielectric 410 has been formed. For example, the support structure 400 may be a silicon-on-insulator wafer having top silicon as the upper substrate 415 and a support wafer as the lower substrate 405 between which an oxide 410 has been formed. A typical approach for forming such a structure 400 may include implanting ions, such as oxygen or nitrogen ions having a controlled depth in the structure. Subsequent annealing can be performed to react the oxygen or nitrogen in the structure to form an oxide or nitride of the substrate material, thereby forming the embedded dielectric.

For one embodiment, the substrates 405 and 415 are monocrystalline silicon substrates of a first conductivity type. For a further embodiment, substrates 405 and 415 are p-type or n-type monocrystalline silicon substrates. For another embodiment, the dielectric 410 has a thickness of approximately 20-200 nm. The dielectric 410 will function as a bottom isolation region for one or more future memory cells. For one embodiment, the dielectric 410 is a silicon oxide layer.

If the upper substrate 415 is thicker than desired, it may be reduced by oxidizing its surface followed by a removal of the surface oxide. Alternatively, the thickness of the upper substrate 415 may be reduced using chemical-mechanical planarization (CMP). If the upper substrate 415 is thinner than desired, it may be increased by epitaxial growth as described below. In general, the desired thickness of the upper substrate 415 may be in the range of 20-5000 nm, but is generally defined by junction depth, the effective thickness of the dielectric 410 and the desired operating voltages of the device.

Figure 4B:
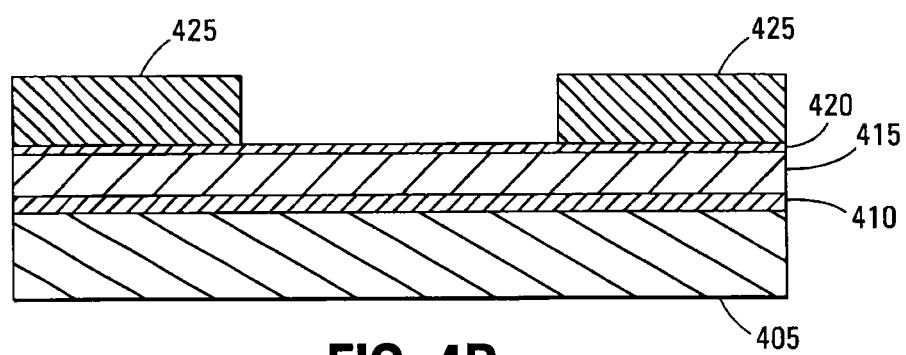

In FIG. 4B, a sacrificial screen 420 is formed overlying the upper substrate 415. The sacrificial screen 420 may be an oxide. For example, a thermal oxide growth may be performed on the upper substrate 415 to grow the sacrificial screen 420. Alternatively, the sacrificial screen 420 may be formed by chemical vapor deposition (CVD) or physical vapor deposition (PVD) processes. In general, the sacrificial screen 420 is a protective layer to reduce surface damage in subsequent processing. A mask 425 is formed and patterned overlying the sacrificial screen 420 to define active areas for the future memory cells. Patterning of such layers is well understood and will not be detailed herein. As one example, in a photolithographic process, a photosensitive resist layer could be formed overlying the sacrificial screen 420 and subsequently exposed and developed to produce the mask 425 exposing one or more portions of the sacrificial screen 420.

Figure 4C:
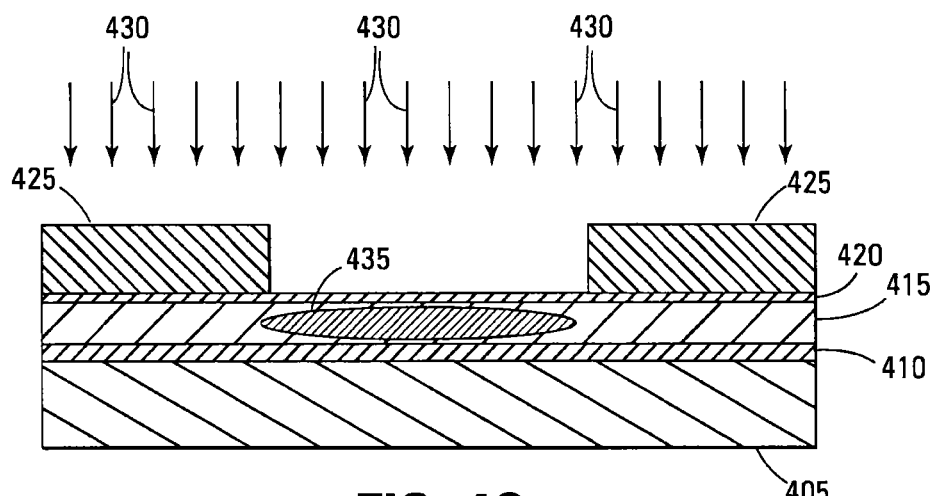

In FIG. 4C, dopant species 430 are implanted through the sacrificial screen 420 to form a buried conductive region such as well 435 having a second conductivity type, such as an n++-type or p++-type conductivity. For one embodiment, the conductive region 435 has a different conductivity than the upper substrate 415. For a further embodiment, the buried well 435 has an n++-type conductivity and the upper substrate 415 has a p-type conductivity. The upper substrate 415 may further be intrinsic. To produce an n++-type conductivity, the dopant species 430 may include arsenic (As), antimony (Sb), phosphorus (P) or another n-type impurity. To produce a p++-type conductivity, the dopant species 430 may include boron (B) or another p-type impurity.

Figure 4D:
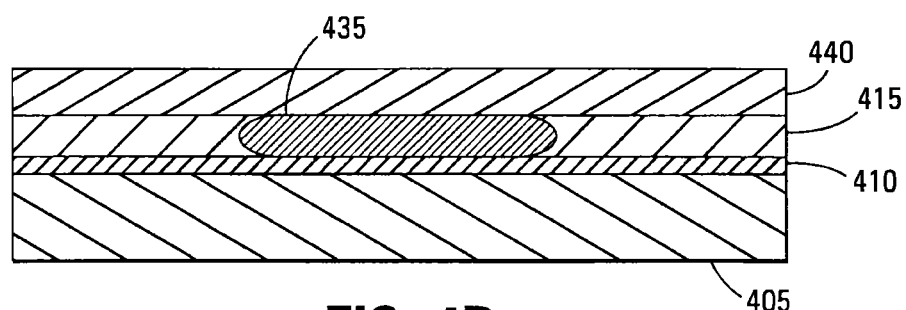

In FIG. 4D, the upper substrate 415 is annealed to activate and diffuse the conductive region 435. Also in FIG. 4D, semiconductor material 440 is formed on the upper substrate 415. For one embodiment, the semiconductor material 440 is an epitaxial silicon growth. Epitaxial formation of silicon is a chemical vapor deposition (CVD) process. The process will replicate the structure of the silicon material upon which it is formed. For example, if the base structure is of monocrystalline silicon, the epitaxial growth will maintain the same monocrystalline structure. Silicon precursors are transported to, and adsorbed on, the exposed silicon structures. Common silicon precursors for the production of epitaxial silicon include silicon tetrachloride ($SiCl_4$), trichlorosilane (Si-$HCl_3$), dichlorosilane ($SiH_2Cl_2$) and silane ($SiH_4$).

The process of epitaxial silicon growth is well understood in the art. Typical deposition temperatures range from about 600° C. to about 1250° C. Depth of the epitaxial growth is typically controlled through reaction time, or time that the silicon structures are exposed to the reactant gases and their reaction conditions. Typical reaction times may range from about 1 minute to about 15 minutes or more, depending upon the desired depth of deposition.

Selective epitaxial deposition occurs when silicon atoms having high surface mobility are deposited from the silicon precursor. These silicon atoms migrate to sites on exposed silicon structures, where nucleation is favored. Others have observed that silicon mobility is enhanced by the presence of halides in the reaction gases. Other factors recognized to enhance the selective nature of the silicon deposition include reduced reaction pressure, increased reaction temperature and decreased mole fraction of silicon in the reaction gases.

For one embodiment, the epitaxial silicon growth is undoped during formation. For another embodiment, the epitaxial silicon growth is doped during formation. Doping of the epitaxial silicon growth can be used to alter the conductive properties of the resulting silicon layer, to reduce the temperature of formation or to otherwise alter the properties of the resulting material. The dopants, which are sometimes referred to as impurities, are added to the reaction gases during the epitaxial silicon growth. Doping epitaxial growth is typically carried out by adding hydrides of the dopant materials to the reaction gases. For example, diborane ($B_2H_6$) may be added to the reaction gases to form a boron-doped (a p-type) monocrystalline silicon.

Figure 4E:
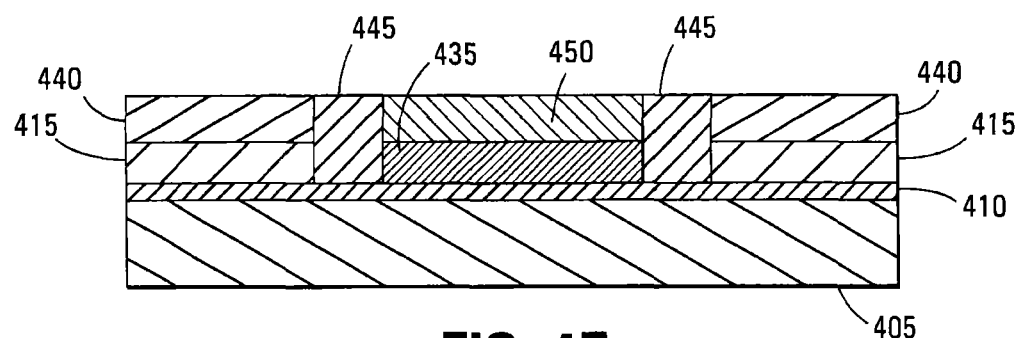

In FIG. 4E, deep trench isolation structures 445 are formed to isolate, from adjacent active regions, the buried well 435 of the second conductivity type and an upper well 450 of the first conductivity type, which is the portion of the semiconductor material 440 located within the confines of the deep trench isolation structures 445. As used herein, the term deep trench refers to a trench that extends to, or penetrates through, the dielectric 410 of the support structure used for forming the memory cells. Although not depicted in FIG. 4E, the deep trench isolation structures 445 form a closed structure around the buried well 435 and upper well 450 overlying the bottom isolation region 410, thereby isolating the buried well 435 and the upper well 450 from other adjacent portions of the upper substrate 415 and the semiconductor material 440. The closed structure defined by the deep trench isolation structures 445 and the bottom isolation region 410 can be thought of as a container structure having sides and a bottom, but being open at the top, resembling an open box or bowl.

Formation of deep trench isolation structures is well understood and may include single-step trench formation or multi-step trench formation. For example, the deep trench isolation structures 445 could be formed by patterning a mask layer (not shown) to define areas for deep trench isolation structures 445, portions of upper substrate 415 and semiconductor material 440 could be removed from the defined areas, such as by etching, to form the trenches extending to the dielectric 410, and the resulting trenches could be filled with a dielectric material, such as by blanket deposition of a dielectric material followed by CMP to form the deep trench isolation structures 445 as depicted in FIG. 4E.

Figure 5A:
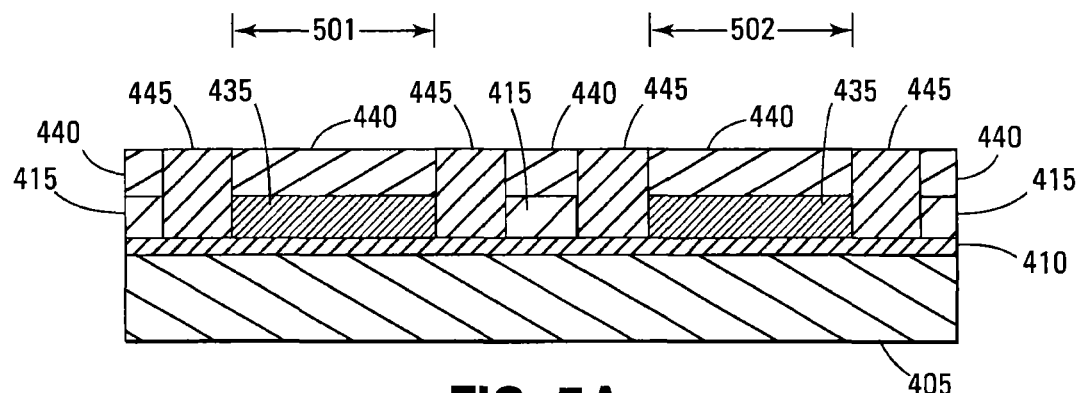
FIGS. 5A-5C depict some alternate configurations of deep trench isolation structures in accordance with embodiments of the disclosure.
Figure 5B:
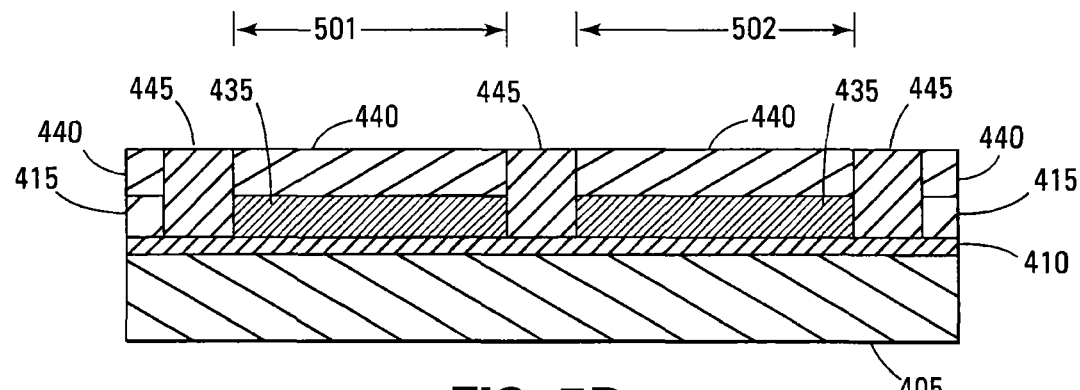
Figure 5C:
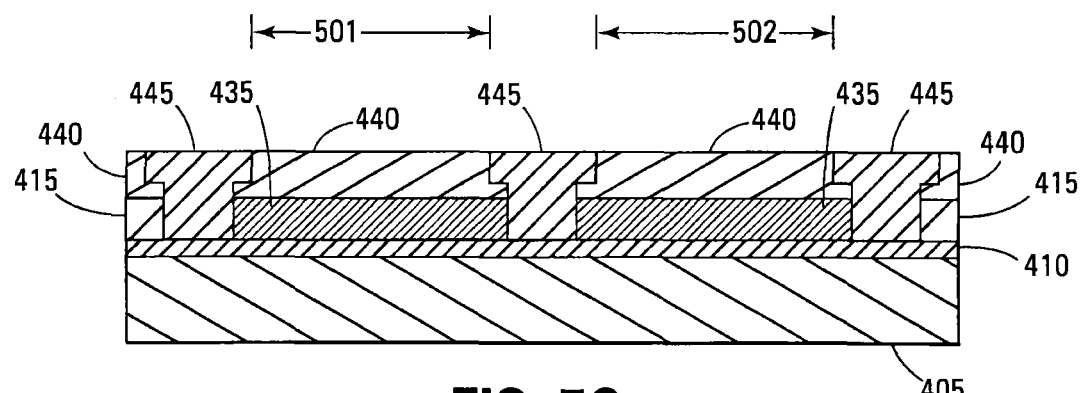

Alternatively, a multi-step trench formation may be used to form the deep trench isolation structures 445. As one example, a hard mask (not shown), such as a pad oxide and/or pad nitride, may be formed overlying the semiconductor material 440 and patterned to define areas for formation of the deep trench isolation structures 445. Portions of at least the semiconductor material 440 are then removed. Portions of the upper substrate 415 may also be removed, but the resulting trenches would not extend to the dielectric 410. These trenches are then partially filled with a dielectric material to cover the sidewalls and bottoms of the trenches, but to leave the trenches unfilled. An anisotropic removal is then performed on the dielectric material to preferentially remove dielectric material from the bottoms of the trenches, thereby exposing a portion of the bottom of each trench but leaving the sidewalls covered. Further material is then removed from the bottom of the trenches down to the dielectric 410. The trenches are then further filled with dielectric material and planarized to form the deep trench isolation structures 445 having a generally T-shape as depicted in FIG. 5C. It is noted that deep trench isolation structures may be formed to be substantially even with an upper surface of the semiconductor material 440 by removing the hard mask prior to planarization, or they may be formed to extend above the upper surface of the semiconductor material 440 by planarizing prior to removing the hard mask. Although not essential to this invention, formation of isolation structures using multi-step trench formation is detailed in U.S. Patent Application Publication Serial No. 2006/0043455 A1 to Batra et al. published on Mar. 2, 2006. The deep trench isolation structures 445 may be filled with one or more dielectric materials. Some examples include silicon dioxide ($SiO_2$), silicon nitride ($Si_3N_4$) and silicon oxynitrides ($Si_xO_yN_z$), spin-on dielectrics as well as other dielectrics.

Figure 4F:
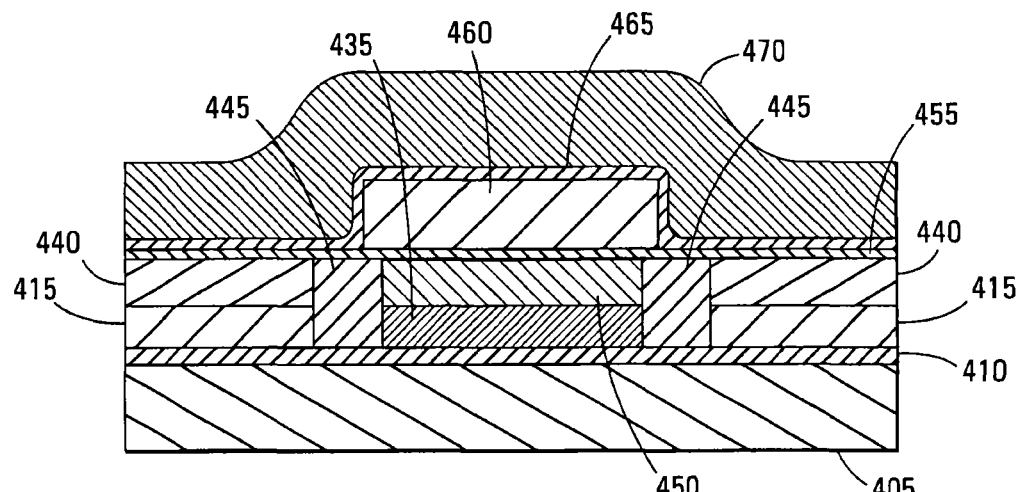

In FIG. 4F, the remaining structures of the memory cells are formed. As depicted in FIG. 4F, a tunnel or gate dielectric 455 is formed overlying at least a portion of the semiconductor material 440 located within the confines of the deep trench isolation structures 445. A floating-gate or other charge-storage node 460 is formed overlying the gate dielectric 455. The charge-storage node 460 may extend over portions of the deep trench isolation structures 445 as depicted in FIG. 4F or it may be laterally separated from the deep trench isolation structures 445 in some embodiments. An intergate dielectric 465 is formed overlying the charge-storage node 460 and a conductive control gate 470 is formed overlying the intergate dielectric 465. For embodiments where the charge-storage node 460 is a dielectric charge-trapping material, the gate dielectric 455 and/or the intergate dielectric 465 may be omitted.

Gate dielectric 455 is generally a silicon dioxide, but may include other dielectric materials, including silicon nitride and silicon oxynitrides as well as high-K dielectrics. Some examples of high-K dielectric materials include dielectric metal oxides, including hafnium-based oxides such as $HfO_2$, barium strontium titanate (BST), lead zirconium titanate (PZT) and lead lanthanum titanate (PLZT), $Al_2O_3$, AlO, ZrO and others. Other classes of high-K dielectrics include dielectric metal oxynitrides and dielectric metal silicates.

Charge-storage node 460 is one or more layers of material that will store the charge indicative of a programmed state of the memory cells. A common choice for charge-storage node 460 is a polysilicon (polycrystalline silicon) layer, but could also include other forms of doped or undoped silicon materials, such as monocrystalline silicon, nanocrystalline silicon and amorphous silicon, as well as other materials capable of holding a charge. The floating-gate layer 460 may be formed by such techniques as CVD or PVD, and may be conductively doped during or following formation.

The intergate dielectric 465 contains a dielectric material. Some examples include silicon oxides, silicon nitrides or silicon oxynitrides. Further examples include dielectric metal oxides such as BST, PZT, PLZT, $Al_2O_3$, AlO, HfO, ZrO and others, as well as dielectric metal oxynitrides and dielectric metal silicates. Dielectric layers may further contain multiple layers of dielectric materials. One common example is an ONO (oxide-nitride-oxide) dielectric layer.

The control gate 470 is generally one or more layers of conductive material. For one embodiment, the control gate 470 contains a conductively-doped polysilicon. For a further embodiment, the control gate 470 includes a metal-containing layer overlying a polysilicon layer, e.g., a refractory metal silicide layer formed on a conductively-doped polysilicon layer. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. For another embodiment, the control gate 470 contains multiple metal-containing layers, e.g., a titanium nitride (TiN) barrier layer overlying the intergate dielectric 465, a titanium (Ti) adhesion layer overlying the barrier layer and a tungsten (W) layer overlying the adhesion layer. An insulative cap layer (not shown) is often formed overlying the control gate 470 to protect and isolate the control gate from further processing.

It is noted that FIGS. 4A-4F depict a portion of a row of memory cells running parallel to a face plane of the drawings. It is noted that FIGS. 4A-4F can depict either a NOR-type memory device or a NAND-type memory device, with the differences occurring in the column direction in manners that are well understood in the art of memory fabrication.

Each memory cell or group of memory cells may have their own distinct deep trench isolation structures 445, or they may share deep trench isolation structures 445. FIGS. 5A-5C depict some alternate configurations of deep trench isolation structures 445 in accordance with embodiments of the disclosure. In FIG. 5A, a first area 501 for formation of memory cells has its deep trench isolation structures 445 laterally separated from the deep trench isolation structures 445 for a second area 502 for formation of memory cells. In FIGS. 5B and 5C, the first area 501 for formation of memory cells and the second area 502 for formation of memory cells share a portion of the deep trench isolation structures 445. FIG. 5C depicts a trench isolation structure having both shallow and deep portions as described with reference to formation using multi-step trench formation. Note that as shallow trench isolation (STI) is a part of standard CMOS structures, combining it with a deep trench may simplify the overall isolation process. Note also that the deep trench isolation structures 445 can isolate active areas of differing conductivity types. For example, in FIGS. 5A-5C, the buried well 435 of the first area 501 may have a first conductivity type while the buried well 435 of the second area 502 may have a second or differing conductivity type.

Figure 6:
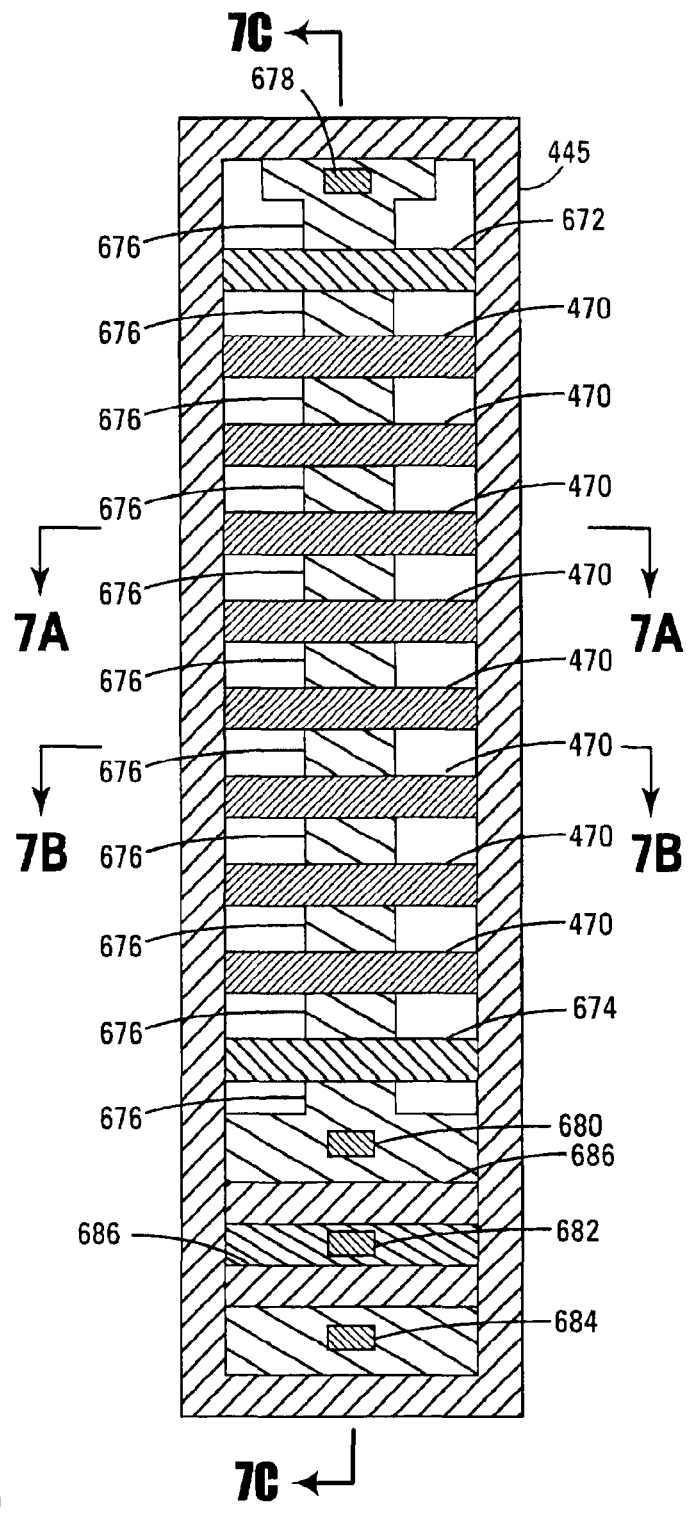
FIG. 6 is a top view of dielectrically isolated NAND string in accordance with an embodiment of the disclosure.

FIG. 6 is a top view of a dielectrically isolated NAND string in accordance with an embodiment of the disclosure. As shown in FIG. 6, the deep trench isolation structures 445 isolate the active region in which the NAND string is formed by creating a dielectric barrier around portions of the NAND string formed in the upper well region 450 and lower well region 435 (not shown in FIG. 6). The NAND string includes two or more serially-connected memory cells as depicted by the control gates 470 with interposing source/drain regions 676. Although depicted as an 8-cell NAND string, the NAND strings could contain any number of memory cells. Furthermore, while FIG. 6 depicts only one NAND string within the confines of the deep trench isolation structures 445, each NAND string associated with a single bit line may be isolated as a set. For example, with reference to FIG. 2, all memory cells 208 associated with bit line $204_1$ may be contained within a deep trench isolation structure, which may include one or more upper well contacts 682 and one or more buried well contacts 684. As used herein, a memory cell is contained within an isolation structure when that memory cell's corresponding semiconductor conductive regions have at least their sidewalls and bottom surfaces located within the isolation structure.

At one end of the NAND string of FIG. 6, a first (e.g., drain) select gate, depicted by gate 672, selectively couples the NAND string to a bit line contact 678. At the other end of the NAND string, a second (e.g., source) select gate, depicted by control gate 674, selectively couples the NAND string to a source contact 680. An upper well contact 682 provides for electrical coupling to the upper well of the isolated structure and a buried well contact 684 provides for electrical coupling to the buried well of the isolated structure. The upper well contact 682 and the buried well contact 684 are isolated from each other and from the source contact 680 using isolation structures 686. Isolation structures 686 may be STI structures. They may be formed separately from, or concurrently with, deep trench isolation structures 445. Although not essential to this invention, concurrent formation of isolation structures having multiple depths is detailed in U.S. Patent Application Publication Serial No. 2006/0043455 A1 to Batra et al. published on Mar. 2, 2006.

It is further noted that the placement of the upper well contact 682 and the buried well contact 684 in relation to each other, and in relation to the bit line contact 678 and the source contact 680, does not have to be as depicted in FIG. 6. For example, the upper well contact 682 and the buried well contact 684 could be positioned adjacent the bit line contact 678, or the upper well contact 682 could be positioned adjacent the bit line contact 678 while the buried well contact 684 is positioned adjacent the source contact 680. Other orderings will be apparent upon review of the figures. Similarly, more than one upper well contact 682 and/or more than one buried well contact 684 may be used for each NAND string.

Figure 7A:
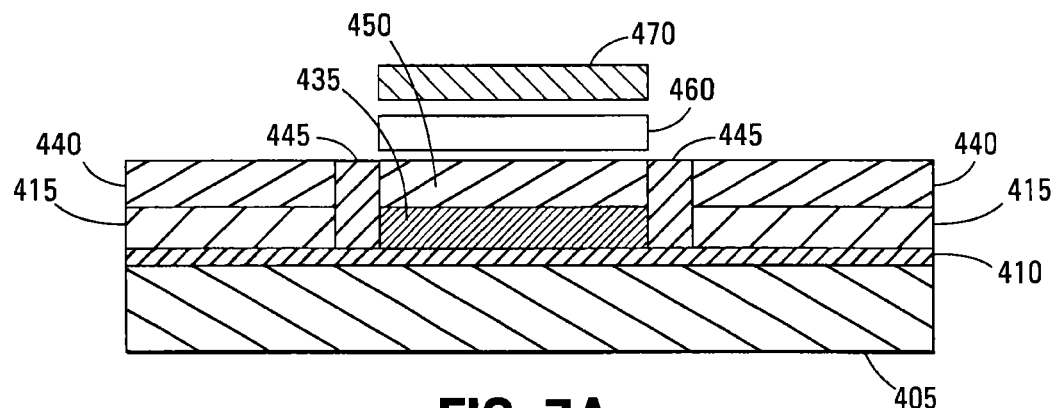
FIGS. 7A-7C are simplified cross-sectional views of the NAND string of FIG. 6 taken along various cross-sections.
Figure 7B:
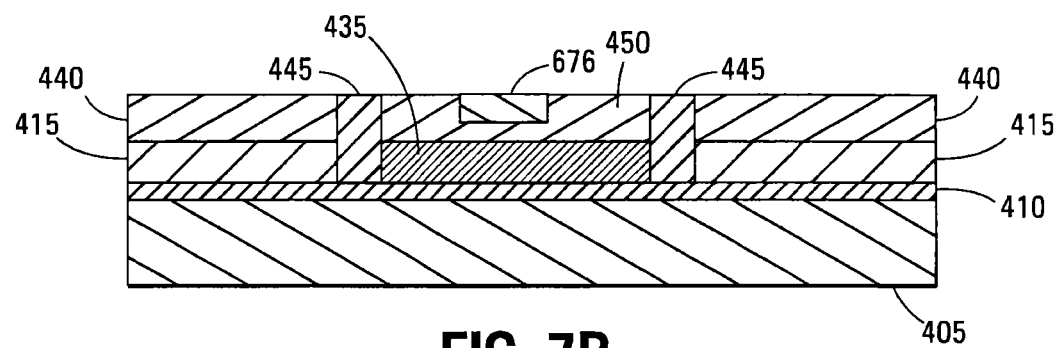
Figure 7C:
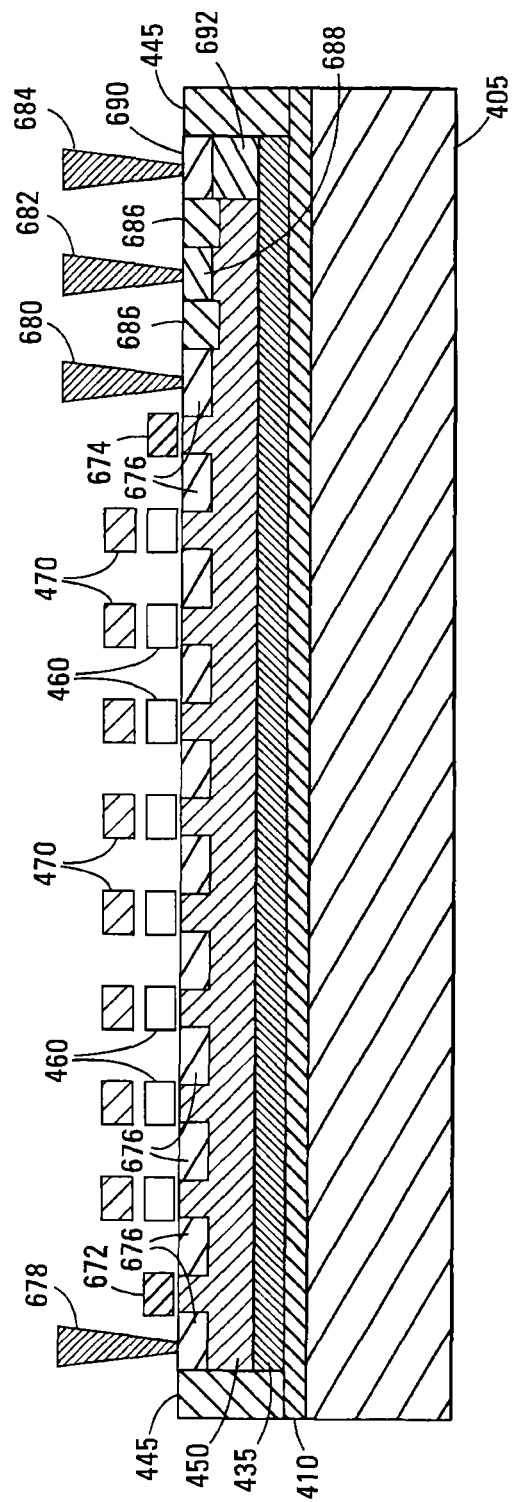
Figure 9:
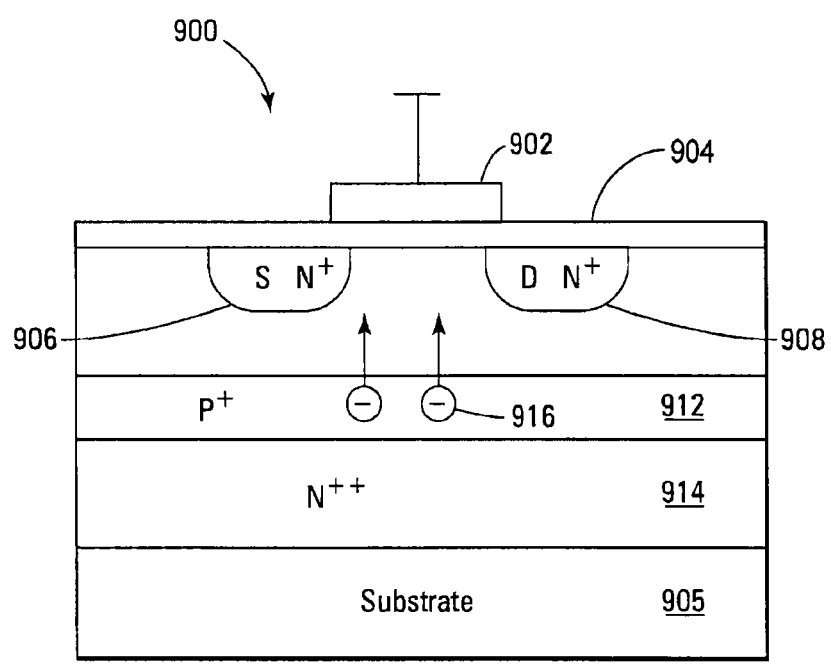
FIG. 9 illustrates a prior art BiMOS test structure used to study physical mechanisms of electron trapping in MOS gate oxides.

FIGS. 7A-7C are simplified cross-sectional views of the NAND string of FIG. 6 taken along lines A-A, B-B and C-C, respectively. In FIG. 7C, the connectivity to the upper well 450 and the buried well 435 are better shown. As shown in FIG. 7C, the upper well contact 682 may be coupled to the upper well 450 through a conductive region 688 having the same conductivity type as the upper well 450. For example, where the upper well 450 has a p-type conductivity, the conductive region 688 may have a p+-type conductivity. As further shown in FIG. 7C, the buried well contact 684 may be coupled to the buried well 435 through one or more conductive regions, such as conductive regions 690 and 692, having the same conductivity type as the buried well 435. For example, where the buried well 435 has an n++-type conductivity, the conductive regions 690 and 692 may have an n+-type conductivity. The source/drain regions 676 also have the same conductivity type as the buried well 435. For example, where the buried well 435 has an n++-type conductivity, the source/drain regions 676 may have an n+-type conductivity. The bit line contact 678 is coupled to a source/drain region 676 of the first select gate 672 while the source contact 680 is coupled to a source/drain region 676 of the second select gate 674.

The conductive regions 690 and 692, collectively referred to as a sinker contact, may be formed during separate processes. For example, the conductive region 692 may be formed using a deep implant process to drive dopant species into the upper well 450 to contact the buried well 435. The conductive region 690 may then be formed concurrently with the source/drain regions 676 using a shallow implant process to improve the conductivity between the conductive region 692 and the buried well contact 684. The conductive region 688 may also be formed using a shallow implant process, but using different dopant species than the source/drain regions 676.

FIG. 8A-8B are simplified cross-sectional views of memory cells for use in a memory array utilizing a NOR architecture. As with the NAND string of FIG. 6, the memory cells of FIGS. 8A-8B would be isolated by the deep trench isolation structures 445. Like reference numbers describe like elements. For each configuration, connectivity to the upper well 450 and buried well 435 are generally as described with reference to FIG. 7C. The structure of FIG. 8A depicts an isolation structure having one memory cell having its source/drain regions 676 contained within the deep trench isolation structures 445. The structure of FIG. 8B depicts an isolation structure having two memory cells having their source/drain regions 676 contained within the deep trench isolation structures 445 and sharing a single source contact 680. As an extension of FIG. 8B, all memory cells associated with a single bit line may be isolated as a set by being located within the confines of the deep trench isolation structures 445. For example, with reference to FIG. 3, all memory cells 308 associated with bit line $304_1$ may be contained within a deep trench isolation structure, which may include one or more upper well contacts 682 and one or more buried well contacts 684.

Read and erase of the memory cells of FIGS. 6-8B may be accomplished using conventional flash memory techniques. The charge stored on the floating gate is sensed by grounding the source and applying a control gate and drain bias. The conductivity of the memory cell transistor as a result of the charge state of the floating gate is determined. An erase is accomplished by applying a "large" negative control gate voltage and tunneling electrons off of the floating gate.

In general, to program the memory cells of FIGS. 6-8B, the buried well 435 to upper well 450 junction is forward biased at high-level injection. The control gate 470 of the selected cell is biased high while the control gate 470 of any unselected cells are biased to flat-band or accumulation. Actual voltage levels are dependant upon the physical construction and materials used in fabricating the memory cells, such as the gate dielectric and the charge-storage node or floating gate. In general, the control gate 470 is biased to a higher positive voltage level than any source/drain regions 676. Electrons are accelerated from the buried well 435 to the charge-storage node 460 in a vertical electric field developed between the negatively-biased buried well 435 and positively-biased control gate 470. The upper well 450 may be biased to an intermediate voltage, such as a ground potential, or the upper well 450 may be allowed to float.

The accelerated electrons are injected into a surface depleted channel region of the memory cell. That is, electrons injected across a p-type upper well 450 are accelerated in a vertical electric field of the surface depleted channel region located between the source/drain regions 676 of each selected memory cell and injected over the gate dielectric 455 barrier onto the charge-storage node 460.

The electrons need to acquire an energy greater than that of the gate dielectric barrier at the surface (3.2 eV for silicon dioxide) to overcome the barrier and be injected onto the floating gate. The required potential drop across the surface depletion region can be established by a positive control gate 470 voltage during the write operation. For one embodiment, the control gate 470 voltage of a selected memory cell is less than about 5V.

During a program operation, some electrons will not gain enough energy to overcome the dielectric barrier to reach the charge-storage node. That is, many electrons may be scattered before they reach the gate dielectric-channel interface and will lose energy. These scattered electrons can be collected by providing a reverse bias on the bit line contacts 678 and source contacts 680. The bit line and source contacts should be biased with a magnitude of an applied potential so that they can collect any extra electrons accumulating at the surface and those not overcoming the surface barrier.

CONCLUSION

Memory devices have been described having memory cells contained within dielectric isolation structures. The dielectric structures can be used to isolate the memory cells from at least those memory cells in communication with other bit lines and to facilitate forward-bias write operations. The dielectric isolation structures contain an upper well having a first conductivity type and a buried well having a second conductivity type. By forward biasing the junction from the buried well to the upper well, electrons can be injected into charge-storage nodes of memory cells that are contained within the dielectric isolation structures.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of programming a memory device, comprising:

biasing a control gate of a selected memory cell of the memory device to a first voltage, the control gate being over a first conductive region having a first conductivity type and the first conductive region being over a second conductive region having a second conductivity type different than the first conductivity type;

biasing the second conductive region to a second voltage to forward bias a junction from the second conductive region to the first conductive region; and injecting electrons into a charge-storage node of the selected memory cell from the second conductive region;

wherein the first conductive region and the second conductive region are contained within a dielectric isolation structure in which at least the selected memory cell is contained.

2. The method of claim 1, further comprising:
floating the first conductive region while biasing the second conductive region to the second voltage.

3. The method of claim 1, further comprising:
biasing the control gate of the selected memory cell to a positive voltage while biasing the second conductive region to a negative voltage.

4. The method of claim 1, further comprising:
reverse biasing one or more source/drain regions contained in the first conductive region to collect the electrons accumulating at a surface of the first conductive region.

5. The method of claim 1, further comprising:
biasing control gates of corresponding unselected memory cells of the memory device and contained within the dielectric isolation structure to flat-band or accumulation.

6. The method of claim 1, further comprising:
biasing the control gate of the selected memory cell to a positive voltage;
floating the first conductive region having a p-type conductivity; and
biasing the second conductive region having an n++-type conductivity to a negative voltage.

7. The method of claim 1, wherein injecting the electrons into the charge-storage node of the selected memory cell from the second conductive region comprises injecting the electrons over a gate dielectric barrier and into the charge-storage node of the selected memory cell.

8. The method of claim 1, wherein injecting the electrons into the charge-storage node of the selected memory cell from the second conductive region comprises the electrons acquiring an energy greater than that of a gate dielectric barrier at a surface of the gate dielectric.

9. The method of claim 1, further comprising reverse biasing a data line contact coupled to a source/drain region of a select gate coupled to the selected memory cell to collect the electrons accumulating at a surface of the first conductive region, wherein the source/drain region of the select gate is contained in the first conductive region.

10. The method of claim 1, further comprising reverse biasing a source contact coupled to a source/drain region of a select gate coupled to the selected memory cell to collect the electrons accumulating at a surface of the first conductive region, wherein the source/drain region of the select gate is contained in the first conductive region.

11. A method of programming a memory device, comprising:
biasing a control gate of a selected memory cell of the memory device to a first voltage, the control gate being over a first conductive region having a first conductivity type and the first conductive region being over a second conductive region having a second conductivity type different than the first conductivity type;
biasing the second conductive region to a second voltage to forward bias a junction from the second conductive region to the first conductive region;
biasing the first conductive region to a third voltage between the first voltage and the second voltage; and
injecting electrons into a charge-storage node of the selected memory cell from the second conductive region;
wherein the first conductive region and the second conductive region are contained within a dielectric isolation structure in which at least the selected memory cell is contained.

12. The method of claim 11, further comprising:
biasing the control gate of the selected memory cell to a positive voltage;
biasing the second conductive region having an n++-type conductivity to a negative voltage; and
biasing the first conductive region having a p-type conductivity to the third voltage between the positive voltage and the negative voltage.

13. The method of claim 12, further comprising:
biasing the first conductive region to a ground potential.

14. The method of claim 11, further comprising:
biasing the control gate of the selected memory cell to a positive voltage while biasing the second conductive region to a negative voltage; and
reverse biasing one or more source/drain regions contained in the first conductive region to collect electrons accumulating at a surface of the first conductive region.

15. The method of claim 11, further comprising:
biasing control gates of corresponding unselected memory cells of the memory device and contained within the dielectric isolation structure to flat-band or accumulation.

16. The method of claim 11, wherein injecting the electrons into the charge-storage node of the selected memory cell from the second conductive region comprises injecting the electrons over a gate dielectric barrier and into the charge-storage node of the selected memory cell.

17. A method of programming a memory device, comprising:
biasing a control gate of a selected memory cell of a string of memory cells of the memory device to a first voltage, the control gate being over a first conductive region having a first conductivity type and the first conductive region being over a second conductive region having a second conductivity type different than the first conductivity type;
biasing the second conductive region to a second voltage to forward bias a junction from the second conductive region to the first conductive region;
injecting electrons into a charge-storage node of the selected memory cell from the second conductive region;
reverse biasing a source contact coupled to a source/drain region of a first select gate coupled to an end of the string of memory cells; and
reverse biasing a data line contact coupled to a source/drain region of a second select gate coupled to an opposite end of the string of memory cells;
wherein the first conductive region and the second conductive region are contained within a dielectric isolation structure in which the string of memory cells is contained.

18. The method of claim 17, further comprising biasing the control gate of the selected memory cell to a positive voltage while biasing the second conductive region to a negative voltage.

19. The method of claim 17, further comprising floating the first conductive region while biasing the second conductive region to the second voltage.

20. The method of claim 17, further comprising biasing the first conductive region to a third voltage between the first voltage and the second voltage.

* * * * *